United States Patent [19]

Hergault et al.

[11] Patent Number: 5,617,240

[45] Date of Patent: Apr. 1, 1997

[54] AUTOMATIC GAIN CONTROL METHOD AND DEVICE FOR RECEIVING CIRCUITS

[75] Inventors: Stéphane Hergault, la Meziere; Patrick Hardy, Baulon, both of France

[73] Assignee: Thomson-CSF, Paris, France

[21] Appl. No.: 532,816

[22] PCT Filed: Feb. 24, 1995

[86] PCT No.: PCT/FR95/00221

§ 371 Date: Oct. 23, 1995

§ 102(e) Date: Oct. 23, 1995

[87] PCT Pub. No.: WO95/23454

PCT Pub. Date: Aug. 31, 1995

[30] Foreign Application Priority Data

Feb. 25, 1994 [FR] France .................. 94 02194

[51] Int. Cl.⁶ .............................................. H04B 10/06
[52] U.S. Cl. ...................... 359/194; 359/161; 370/491
[58] Field of Search ................... 359/161, 194; 455/234.1, 240.1; 370/74, 98; 375/345

[56] References Cited

U.S. PATENT DOCUMENTS 4,501,022  2/1985  Oswald ............................ 359/194

FOREIGN PATENT DOCUMENTS 0152740  9/1982  Japan .............................. 359/194

Primary Examiner—Wellington Chin
Assistant Examiner—Kinfe-Michael Negash
Attorney, Agent, or Firm—Oblon, Spivak, McClelland, Maier & Neustadt, P.C.

[57] ABSTRACT

A method and apparatus for automatic gain control in a receiver. The input signal to the receiver includes both a DC component and a signal component. Filters are used to separate the two components. The DC component modulates a pilot signal and is then added to the signal component. The combined signal is then amplified to produce an output signal. The output is also filtered and subjected to a synchronous detector to produce a gain control level for the amplifier. The synchronous detector utilizes the filtered output signal to modulate the same pilot signal which is then compared to a reference voltage.

10 Claims, 1 Drawing Sheet

AUTOMATIC GAIN CONTROL METHOD AND DEVICE FOR RECEIVING CIRCUITS

BACKGROUND OF THE INVENTION

1. Field of the Invention

The invention lies in the field of signal reception, and relates to an automatic gain control method and device for receiving circuits.

It relates to the signals transmitted via a transmission channel affecting, in a related way, the DC component of the transmitted signal and the useful signal. This is particularly the case in the field of video communications networks using transmission by optical fibre.

2. Discussion of the Background

Automatic gain control methods for receiving circuits of transmission equipment make it possible to overcome the losses of the transmission channel by monitoring the level of the signal at the equipment output. The overall gain of the system can then be considered as constant. They are usually based on a measurement of the output signal from these receiving circuits so as to act on a gain control of an amplifier making up these circuits so as to compensate for the variations in the signal due to the losses of the transmission channel. It is thus possible to achieve gain slaving by virtue of an error signal derived by comparison of supposedly stable characteristics in the transmitted signal, which are measurable and recognizable in the received signal, with a reference. These characteristics are, for example, the amplitude of synchronization pulses or the peak-to-peak amplitude of the transmission signal. If the useful signal to be transmitted does not possess such characteristics, they can be added artificially to the signal on transmission. Hence a reference signal can be superimposed on the useful signal, for example a signal of known amplitude and the frequency of which is outside the spectral limits of the useful signal, called pilot signal. It may also be envisaged, as described in French Patent Application No. 2 621 753 filed by the Applicant, to add a constant well-defined DC component to the signal to be transmitted in the case in which the latter is devoid thereof, or in the case in which the original DC component is not well defined or stable, the latter then first of all being discarded.

However, the measurements of these reference signals are often tricky, the extraction or the measurement of their intrinsic characteristics being disturbed by the noise of the link. The precision of the gain slaving depends on the transmission quality. In the event of a superposition of a pilot signal in the transmission circuits, an improvement in the signal-to-noise ratio can certainly be obtained by increasing the amplitude of the pilot signal, but then the useful dynamic range of the transmission channel is reduced and the stray intermodulation signals are also increased; an enhancement can also be obtained by refining the filtering in the receiving circuits, but a problem then appears of design of the filter and of stability of the pilot frequency. Moreover, the receiving circuits, the gain control of which is based on a measurement of the level of a transmitted signal, are particularly sensitive to jamming or other interference which desensitizes these receivers. Finally, the reference signals, due to their characteristics, are often outside the passband of the circuits receiving the useful signal; closed-loop slaving of gain of these circuits on the basis of these signals cannot then be achieved.

SUMMARY OF THE INVENTION

The subject of the present invention is an automatic gain control method for a receiver of signals transmitted via a transmission channel affecting, in a related way, the amplitude of the DC component and that of the useful signal of a transmitted signal, characterized in that it consists in amplitude modulating a pilot signal, by the DC component, received by the receiver, of the transmitted signal, the frequency of the pilot signal being within the passband of gain-controlled amplification circuits of the receiver but outside the frequency spectrum of the useful signal transmitted, in adding this modulated signal to the useful signal in order to pass through these amplification circuits, in amplitude demodulating the modulated pilot signal extracted by filtering at the output of the amplification circuits in order to control the gain of these circuits.

The invention makes it possible to achieve automatic, closed-loop control of gain of receiving circuits. The latter may have a capacitive link. The dynamic range of the transmission channel which can be exploited by the useful signal is not affected by the method. In the event that the transmitted signal possess a DC component, for example upon transmission of the signal by optical fibre, the invention does not require the transmission circuits to be modified, thereby allowing compatibility with existing transmitters. By the use of synchronous detection circuits, it allows good slaving precision and very good rejection of the noise of the link. Good protection is obtained with respect to jamming or other stray signals.

BRIEF DESCRIPTION OF THE DRAWING

The characteristics and advantages of the present invention will emerge better from the following description, given by way of example and with reference to the attached single figure which represents an automatic gain control device for a receiver according to the invention.

The single figure shows a block diagram of the device according to the present invention.

DISCUSSION OF THE PREFERRED EMBODIMENT

Figure 1:
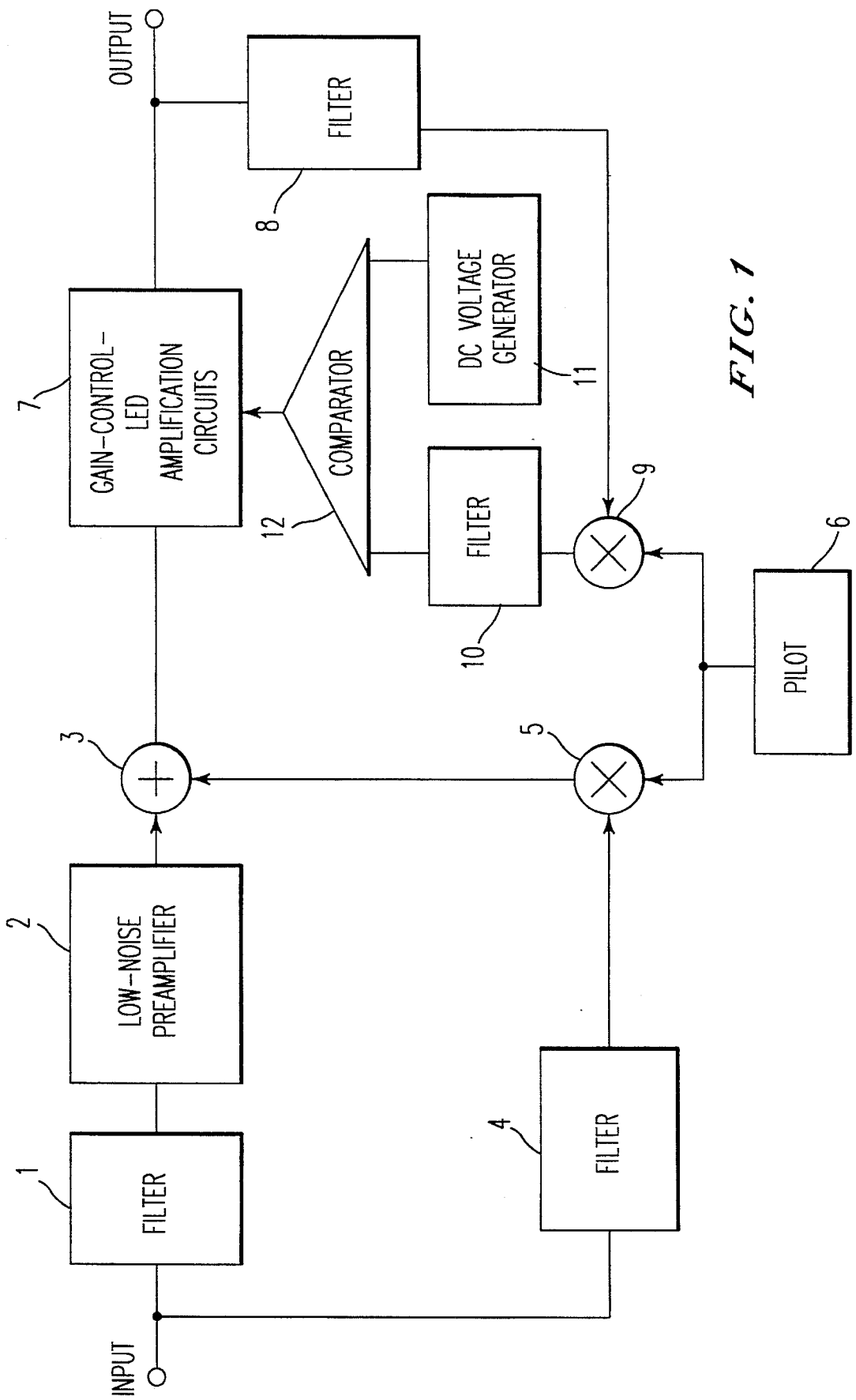

This automatic gain control device is integrated into receiving circuits making up a receiver. The signal present at the input of these circuits is an electrical signal including a DC component and originating from a transmitter via a transmission channel. Hence it is the current detected by the photodiode at the input of the receiver in the case of transmission by optical fibre, it is directly the signal at the input of the receiver in the case of a coaxial link. A first filter 1 of the high-pass or bandpass type receives the electrical signal so as to eliminate the stray signals outside the frequencies of the useful signal and, in particular, the DC component of the received signal.

The filtered signal next feeds a low-noise pre-amplifier 2 which has the role of preamplifying this signal. The output of the preamplifier is linked to a first input of an adder 3.

A second filter 4 at the input of the receiving circuits, of the low-pass type, also receives the electrical signal present at the input of the filter 1 in order to transmit only the DC component of this signal to a first input of a multiplier 5. The second input of this multiplier 5 is fed with a pilot signal originating from a pilot signal generator circuit 6.

The multiplier 5 carries out amplitude modulation of the pilot signal by the DC component present on the first input. It includes the necessary filtering of the modulated signal. The output of this multiplier is linked to the second input of the adder 3 and the output of the adder 3 is linked to the input of gain-controlled amplification circuits 7. Hence the signal to be amplified consists of the useful signal with the addition of the amplitude-modulated pilot signal. It all takes place as if this pilot signal had been added to the useful signal in the transmission circuits, its attenuation corresponding to that of the transmission, characterized by the attenuation of the DC component of the transmitted signal. Two conditions have to be observed as far as the frequency of the pilot signal is concerned: this frequency must be chosen to be within the passband of the gain-controlled amplification circuits 7 but must be outside the frequency spectrum of the useful signal. The modulated pilot signal is thus amplified in the same way as the useful signal, and it is possible to extract it at the output of the amplification circuits 7. To do this, the utilised output of these receiving circuits, which is the output of the gain-controlled amplification circuits 7, is also sent to a bandpass preselector filter 8, centred on the frequency of the pilot signal, then to a first input of a multiplier 9. The second input of the multiplier 9 receives the pilot signal originating from the pilot signal generator 6. The multiplier 9 and the filter 10, of low-pass type, to which the output of the multiplier 9 is linked, carry out amplitude demodulation.

Multiplication of the modulated signal by a periodic auxiliary signal of the same frequency as the carrier of the modulated signal, and filtering of the signal obtained at the output of the multiplier, correspond to synchronous detection. The signal obtained at the output of the filter 10 is the envelope of the amplitude-modulated signal. It corresponds to the DC component of the signal received by the receiver. This synchronous detection allows an enhancement of the signal-to-noise ratio of the detected signal, and thus better accuracy in measuring the signal. The passband of this detector, determined by the low-pass filter 10, may be very restricted and thus achieve good noise rejection. The signal detected at the output of the filter 10 is compared with a reference voltage delivered by a DC voltage generator circuit 11, the comparison being performed by a comparator 12 receiving the detected signal on one channel and the reference voltage on the other channel. The output of the comparator, proportional to the voltage offset, is linked to the gain-control input of the amplification circuits 7 to control the amplification of the latter.

The slaving loop consisting of the circuits 8, 9, 10, 11, 12 thus makes it possible to define an amplification gain related, for example, in an inversely proportional manner, to the level of the DC signal received at the input of the receiving circuits.

For this invention, it is not necessary for the attenuation of the DC component of the transmitted signal to be identical to that of the useful signal. It suffices that a relation links these two attenuations throughout the range of attenuation in order, from the attenuation measured on the DC component, to deduce therefrom that of the useful signal and to correct the gain as a consequence. This relation may be a mathematical function or may be defined by calibration, the calibration curve then being stored in a look-up table memory. A special-purpose circuit, the transfer function of which expresses this mathematical function, or one supplying the memory-stored calibration values, then makes it possible to convert the signal detected at the output of the filter 10 into a signal to be compared, sent to the input of the comparator 12.

We claim:

1. Automatic gain control method for a received signal having a DC and a useful component having a frequency spectrum and going through a gain controlled amplification circuit of a receiver having a passband, that receives the received signal out of a transmission channel, the transmission channel attenuating the DC component and the useful component, the attenuation of the useful component being in a known relationship with the attenuation of the DC component, the method comprising the steps of:

separating the DC component from the received signal;

producing a pilot signal having a frequency within the passband of the gain controlled amplification circuit and outside the frequency spectrum of the useful signal:

modulating in amplitude said pilot signal with the DC component of the received signal and providing a modulated pilot signal;

adding said modulated pilot signal to the useful signal;

amplifying the useful signal and said modulated pilot signal through the gain controlled amplification circuit and providing an amplified modulated pilot signal, and an amplified useful signal;

separating said amplified useful signal from said amplified modulated pilot signal;

demodulating said amplified modulated pilot signal to obtain an amplified level of the DC component of the received signal;

comparing said amplified level of the DC component of the received signal to a reference voltage and obtaining a differential voltage;

using said differential voltage to control the amplification circuit.

2. Method according to claim 1, wherein amplitude demodulation of said amplified modulated pilot signal is a synchronous detection.

3. Method according to claim 2, wherein said pilot signal is used to perform said synchronous detection.

4. Method according to one of claim 1, 2 or 3, wherein said amplified level of the DC component of the received signal is further corrected to take into account known attenuation discrepancies of the transmission channel, between the useful signal and the DC component of the received signal.

5. Device for automatically controlling the gain of a gain controlled amplification circuit having a signal input, a control input, an output, a band pass and being included in a receiver having an input to receive a received signal incoming from a transmission channel, the received signal having a DC component and a useful component having a frequency spectrum, the transmission channel attenuating the DC component and the useful component, the attenuation of the useful component being in a known relationship with the attenuation of the useful component, the device comprising:

a first filter and a second filter, each having an input and an output, said first filter eliminating frequencies outside the frequency spectrum of the useful component and said second filter being of a low pass type to produce at its output the DC component of the received signal, said input of both filters receiving the received signal;

a pilot signal generator that generates on an output of the generator a frequency within the passband of the gain-controlled amplification circuits of the receiver but outside the frequency spectrum of the useful component;

modulating means receiving the DC component of the received signal from said output of said second filter and said pilot signal from said output of said pilot signal generator and delivering a modulated pilot signal;

an adder receiving said modulated pilot signal, said adder also receiving the useful component of the received signal from said output of said first filter and delivering a resultant signal to the signal input of the gain controlled amplification circuit;

a slaving loop for the gain controlled amplification circuit, said loop including:
- a filter coupled to the output of the gain controlled amplification circuit, said filter delivering an amplified modulated pilot signal,
- demodulating means receiving said amplified modulated pilot signal from said filter and delivering an amplified DC component level; and
- a comparator receiving said amplified DC component level and a reference voltage from a DC voltage generator circuit, the output of said comparator being connected to the control input of the controlled amplification circuit.

6. Device according to claim 5, wherein said demodulating means are a synchronous detection circuit receiving said pilot signal from said pilot signal generator.

7. Device according to claim 6, wherein an output of said synchronous detection circuit is coupled to a level correcting circuit to control the gain of the amplification circuit.

8. Device according to claim 4, characterized in that the level-correcting circuit has a transfer function calculated from a relation linking the amplitude of the useful signal to that of the DC component.

9. Device according to claim 7, characterized in that the level-correcting circuit includes memory circuits the contents of which are obtained by calibration of the attenuation of the useful signal from the level of the DC component received.

10. Device according to one of claims 5, 6, 7, 8 or 9, characterized in that the transmission channel is an optical fibre.

* * * * *